United States Patent
Zhu

(10) Patent No.: US 7,883,956 B2
(45) Date of Patent: Feb. 8, 2011

(54) METHOD OF FORMING COPLANAR ACTIVE AND ISOLATION REGIONS AND STRUCTURES THEREOF

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 12/031,760

(22) Filed: Feb. 15, 2008

(65) Prior Publication Data

US 2009/0206441 A1 Aug. 20, 2009

(51) Int. Cl.
*H01L 29/00* (2006.01)
(52) U.S. Cl. .................. 438/221; 438/296; 438/405; 438/407; 438/424; 438/425; 438/440
(58) Field of Classification Search .................. 438/221, 438/296, 359, 400, 403–407, 424–426, 439, 438/440, 444, 445, 449, 450
See application file for complete search history.

(56) References Cited

U.S. PATENT DOCUMENTS

| | | | |
|---|---|---|---|
| 6,146,975 A | 11/2000 | Kuehne et al. | |
| 6,387,742 B2 | 5/2002 | Gauthier, Jr. et al. | |
| 6,830,962 B1 | 12/2004 | Guarini et al. | |
| 6,870,225 B2 | 3/2005 | Bryant et al. | |
| 6,927,146 B2 | 8/2005 | Brask et al. | |
| 2006/0125008 A1 | 6/2006 | Chidambarrao et al. | |
| 2007/0249129 A1* | 10/2007 | Hall et al. | 438/296 |
| 2008/0102601 A1* | 5/2008 | Bourdelle et al. | 438/458 |

* cited by examiner

*Primary Examiner*—David Vu
*Assistant Examiner*—Suberr Chi
(74) *Attorney, Agent, or Firm*—Tan D. MacKinnon; Hoffman Wanick LLC

(57) ABSTRACT

Methods of forming coplanar active regions and isolation regions and structures thereof are disclosed. One embodiment includes shallow-trench-isolation (STI) formation in a semiconductor-on-insulator (SOI) layer on a substrate of a semiconductor structure; and bonding a handle wafer to the STI and SOI layer to form an intermediate structure. The intermediate structure may have a single layer including at least one STI region and at least one SOI region therein disposed between the damaged substrate and the handle wafer. The method may also include cleaving the hydrogen implanted substrate and removing any residual substrate to expose a surface of the at least one STI region and a surface of the at least one SOI region. The exposed surface of the at least one STI region forms an isolation region and the exposed surface of the at least one SOI region forms an active region, which are coplanar to each other.

11 Claims, 6 Drawing Sheets

US 7,883,956 B2

METHOD OF FORMING COPLANAR ACTIVE AND ISOLATION REGIONS AND STRUCTURES THEREOF

BACKGROUND

1. Technical Field

The disclosure relates generally to controlling across-chip-length-variation (ACLV) during formation of a semiconductor structure in complementary metal oxide semiconductor (CMOS) circuits fabrication, and more particularly, to methods of forming coplanar active areas and isolation areas and structures thereof.

2. Background Art

In the current state of the art, continued complimentary metal oxide semiconductor (CMOS) scaling includes scaling of gate structures. With scaling of gate structures, across-chip-length-variation (ACLV) of length of gate structures becomes difficult to control. This difficulty arises from shallow-trench-isolation (STI) surfaces being non-coplanar with surfaces of active silicon regions in gate structures.

A small or good ACLV requires good control over the distance between a lithographic lens and the photo resistance surface to which the lithographic lens is focused. If the surface to which the lithographic lens is focused changes and is not level, control of the distance becomes difficult both within a wafer and/or a chip. Therefore, a flat surface as a starting point for critical lithography is preferred.

SUMMARY

Methods of forming coplanar active regions and isolation regions and structures thereof are disclosed. One embodiment includes shallow-trench-isolation (STI) formation in a semiconductor-on-insulator (SOI) layer on a substrate of a semiconductor structure; and bonding a handle wafer to the STI and SOI layer to form an intermediate structure. The intermediate structure may have a single layer including at least one STI region and at least one SOI region therein disposed between the damaged substrate and the handle wafer. The method may also include cleaving the hydrogen implanted substrate and removing any residual substrate to expose a surface of the at least one STI region and a surface of the at least one SOI region. The exposed surface of the at least one STI region forms an isolation region and the exposed surface of the at least one SOI region forms an active region, which are coplanar to each other.

A first aspect of the disclosure provides a method for forming coplanar active regions and isolation regions in a semiconductor structure, the method comprising: depositing a semiconductor-on-insulator (SOI) layer on a substrate; forming shallow trench isolation (STI) regions in the SOI layer; implanting the substrate with hydrogen; bonding a silicon layer to a surface of the STI region and the SOI layer; cleaving the substrate at a hydrogen implanted layer formed within the substrate; and etching any residual substrate after the cleaving to expose at least one active region and at least one isolation region, wherein the at least one active region and the at least one isolation region are coplanar.

A second aspect of the disclosure provides a semiconductor structure comprising: at least one active region; and at least one isolation region, wherein each of the at least one active region and each of the at least one isolation region is disposed on a substrate, and wherein the each of the at least one active region and each of the at least one isolation region share a coplanar surface.

A third aspect of the disclosure provides a semiconductor structure comprising: at least one active region; and at least one isolation region disposed on a substrate, wherein the each of the at least one active region and each of the at least one isolation region share a coplanar surface.

These and other features of the present disclosure are designed to solve the problems herein described and/or other problems not discussed.

BRIEF DESCRIPTION OF THE DRAWINGS

Various aspects of the disclosure will be more readily understood from the following detailed description taken in conjunction with the accompanying drawings that depict different embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
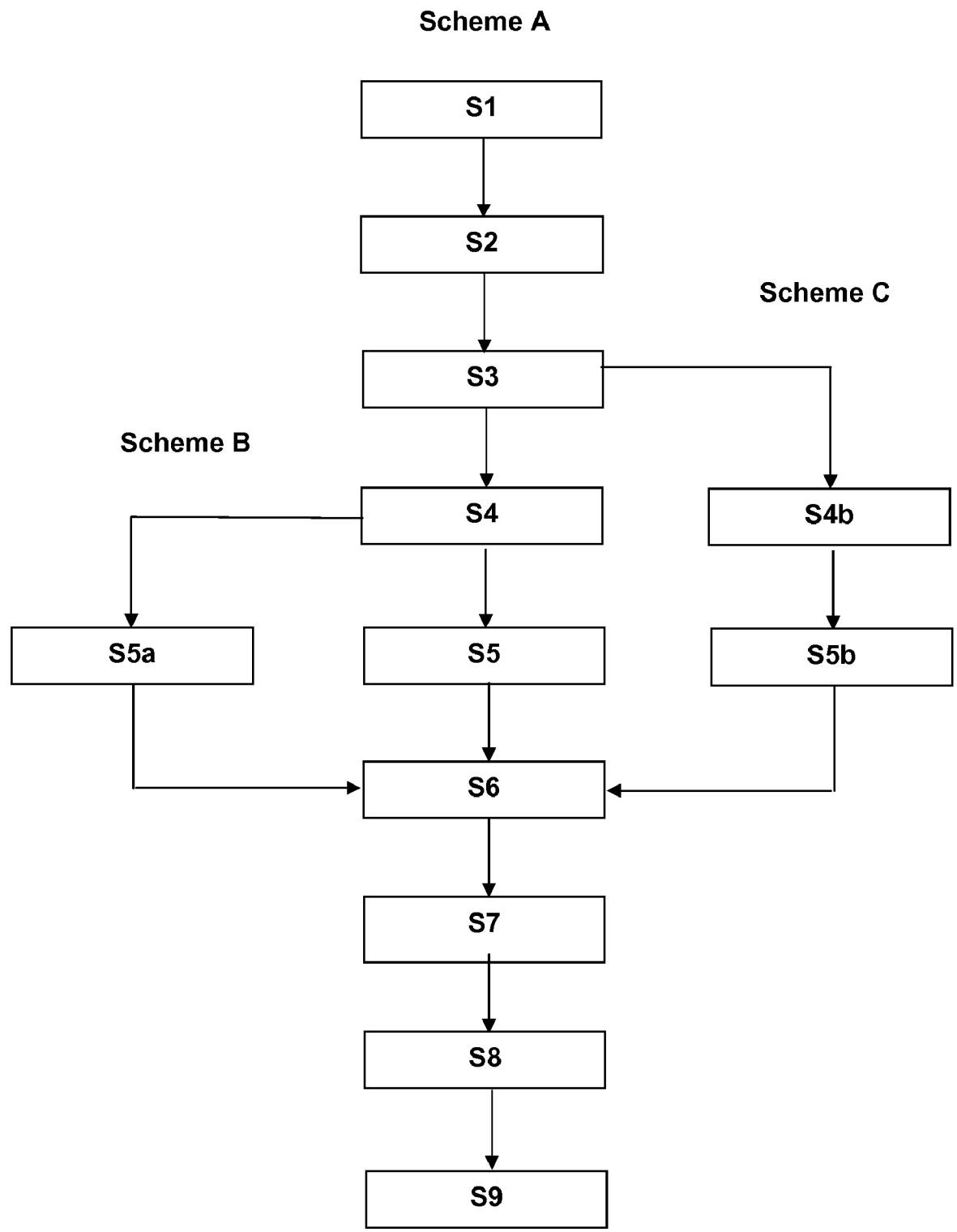
FIG. 1 is a schematic diagram of various schemes for applying a method of the disclosure.

Embodiments depicted in the drawings in FIGS. 1-15 illustrate the methods and various resulting structures of the different aspects of fabricating semiconductor structures 10, 20 and 30 with active regions and isolation regions that share a coplanar surface.

Figure 9:
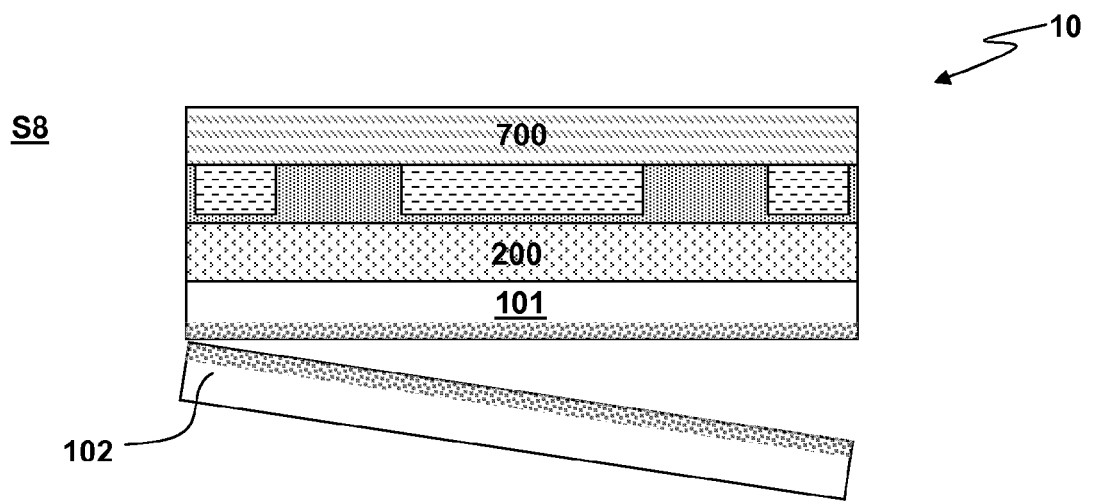
Figure 10:
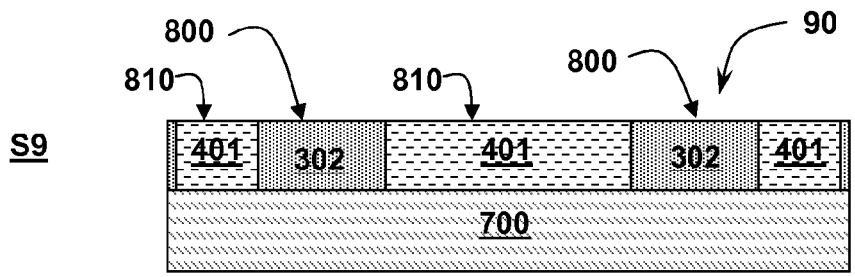
Figure 11:
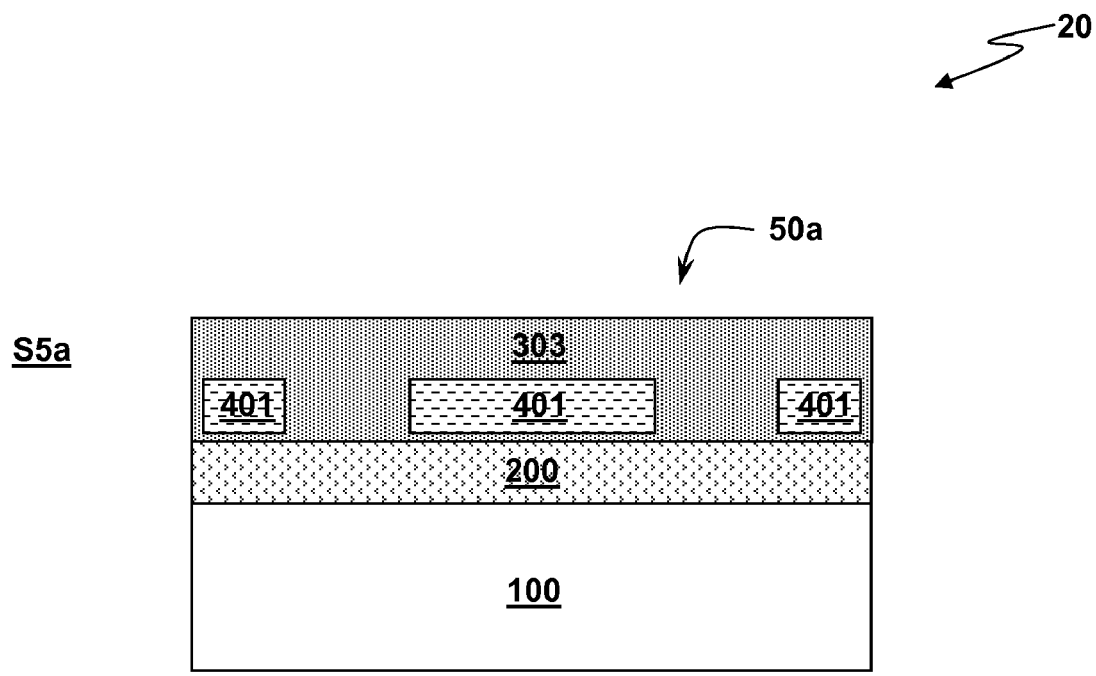
FIGS. 11-12 are cross-sectional views of alternative embodiment(s) of the semiconductor structure according to a scheme B of a method of the disclosure.
Figure 12:
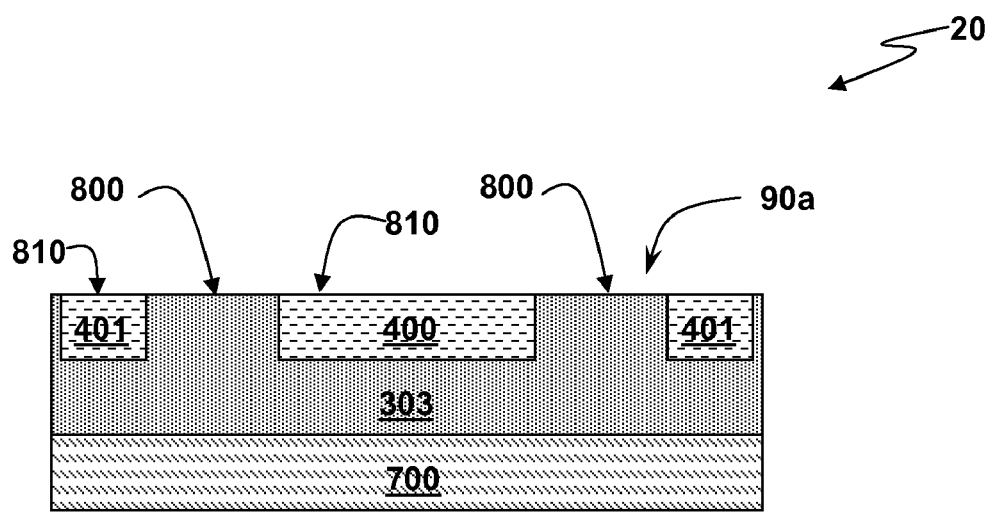
Figure 13:
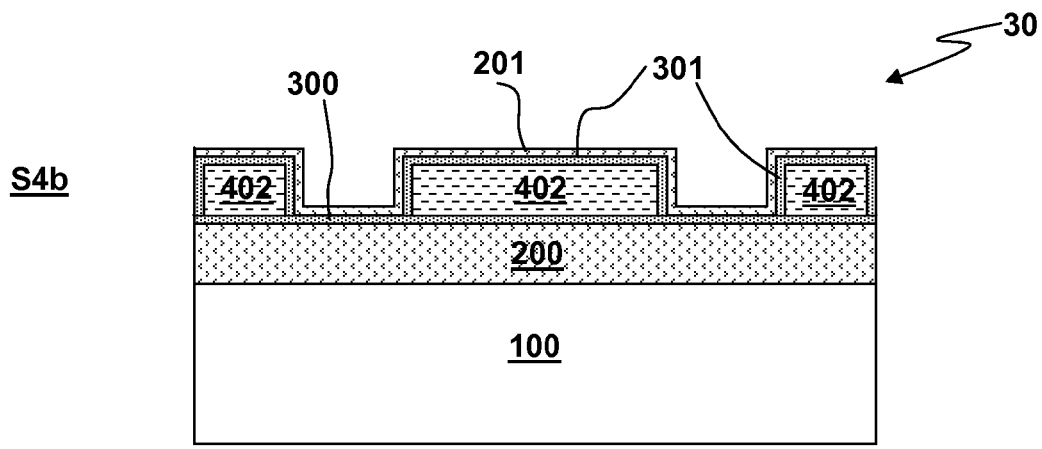
FIGS. 13-15 are cross-sectional views of other alternative embodiment(s) of the semiconductor structure according to a scheme C of a method of the disclosure.
Figure 14:
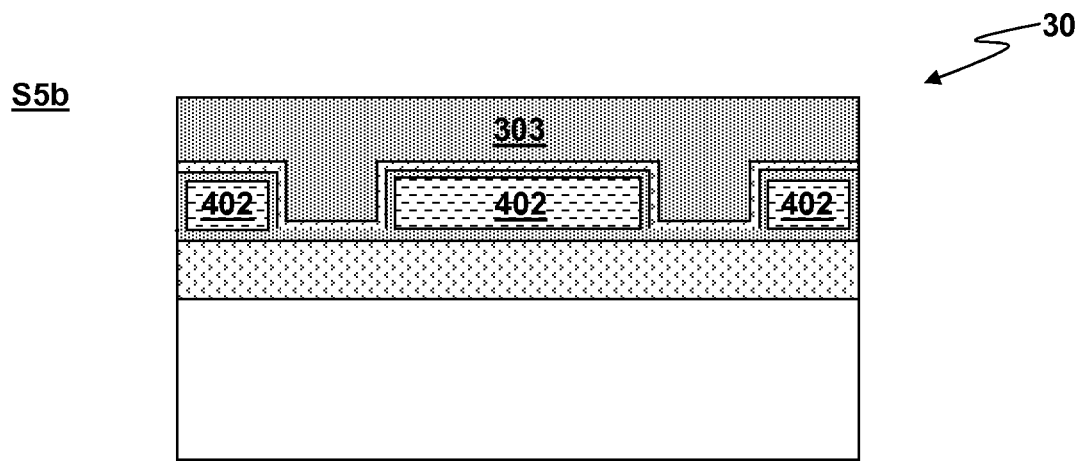
Figure 15:
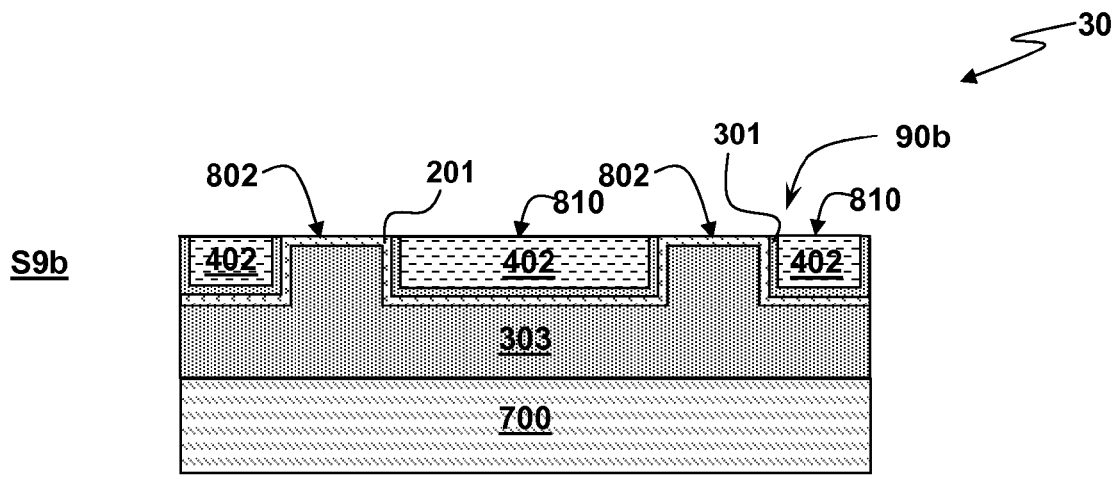

FIG. 1 illustrates various process schemes A, B and C of a method of the disclosure. In one embodiment, scheme A includes the processes S1-S9 that produce a resulting semiconductor structure 10 (FIGS. 2-10). In an alternative embodiment, scheme B includes the processes S1-S4, S5a and S6-S9 that produce a resulting structure 20 (FIGS. 11-12). In yet another embodiment, scheme C includes the processes S1-S3, S4b-S5b and S6-S9 that produce a resulting structure 30 (FIGS. 13-15). Details of the method for producing each respective semiconductor structure 10, 20 and 30 are set out in the following paragraphs.

FIGS. 2-10 illustrate the various embodiments of semiconductor structure 10 at various processes S1-S9 in scheme A according to a method of the disclosure.

Figure 2:
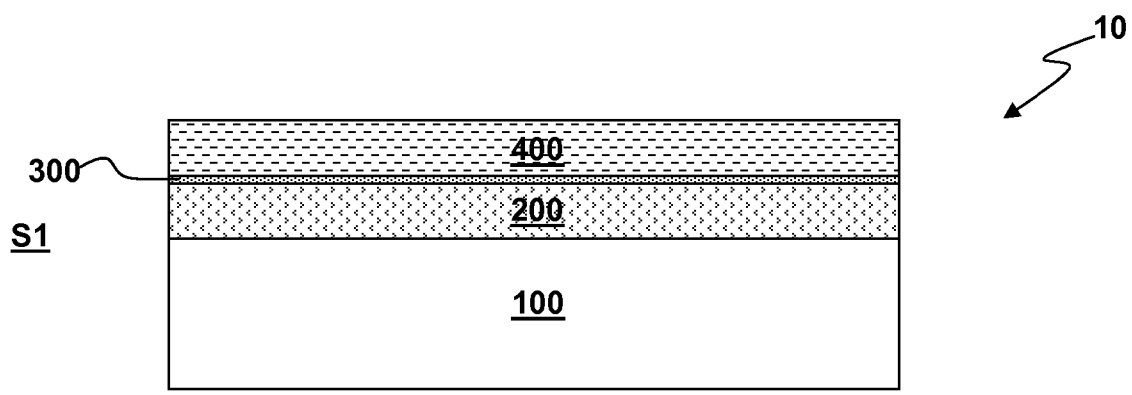
FIGS. 2-10 are cross-sectional views of embodiments of a semiconductor structure according to a scheme A of a method of the disclosure.
Figure 3:
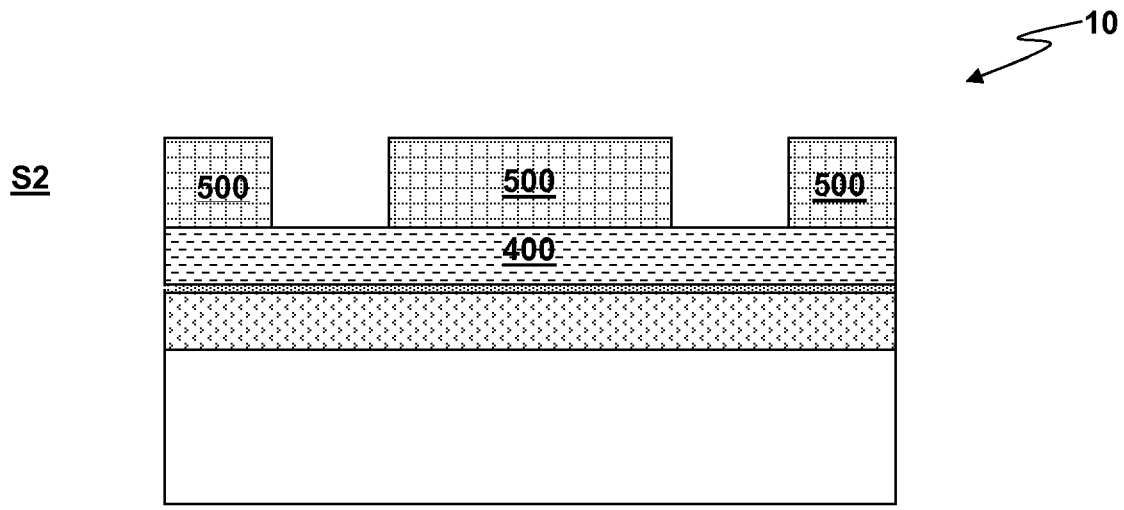
Figure 4:
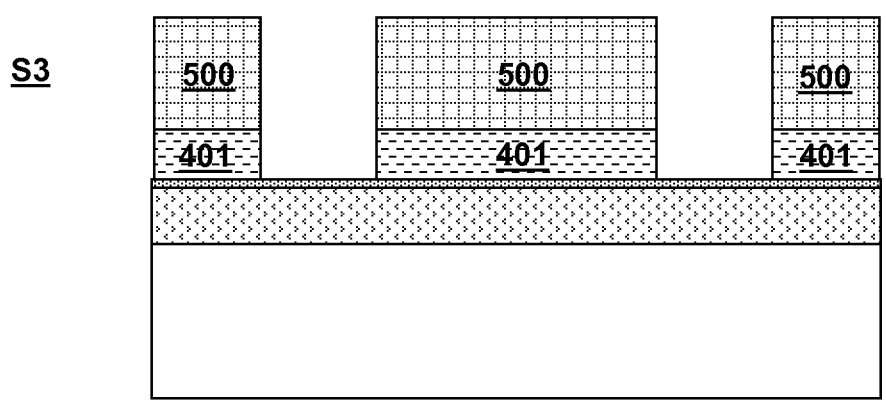

FIG. 2 shows semiconductor structure 10 with a substrate 100 on which a silicon nitride layer 200 is disposed before a thin oxide layer 300 and a semiconductor-on-insulator (SOI) 400 is formed thereon, respectively, using currently known or later developed fabrication techniques represented by process S1 (FIG. 1). Thin oxide layer 300 may be formed using currently known or later developed techniques, for example, but not limited to: thermal oxidation and/or deposition methods. Silicon nitride layer 200 may be of a thickness ranging from approximately 10 nm to approximately 30 nm. FIG. 3 shows a photoresist 500 disposed on SOI 400 in process S2 (FIG. 1) according to currently known or later developed techniques of CMOS fabrication processes. Process S3 includes patterning SOI 400 according to photoresist 500 with currently known or later developed techniques, for example, but not limited to etching to form SOI islands 401 (FIG. 4).

Figure 5:
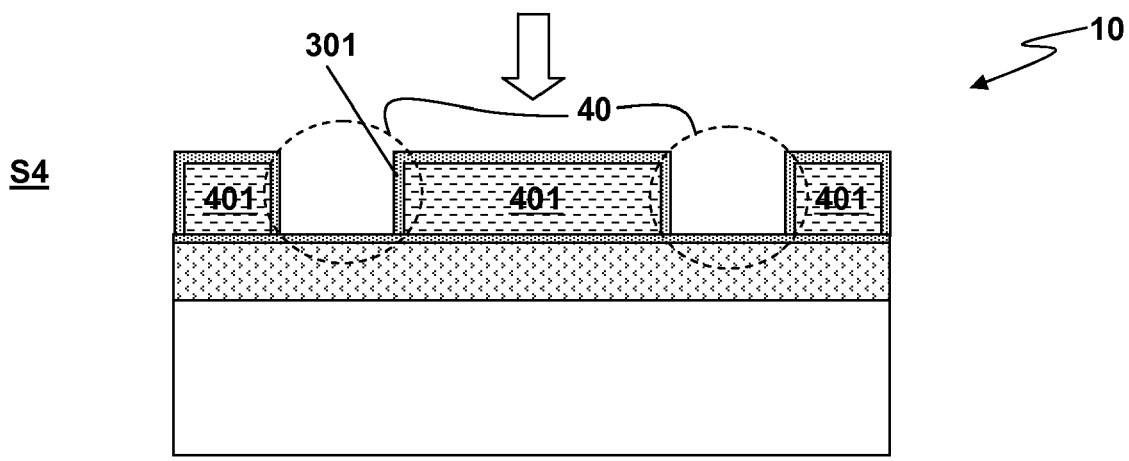
Figure 6:
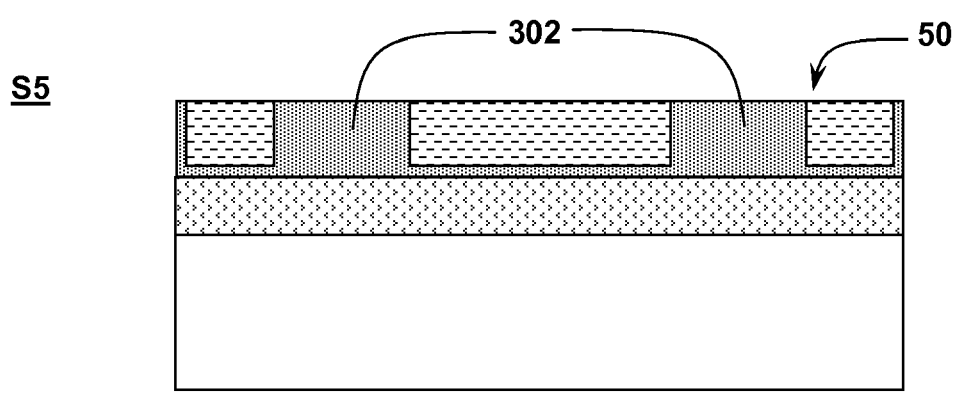
Figure 7:
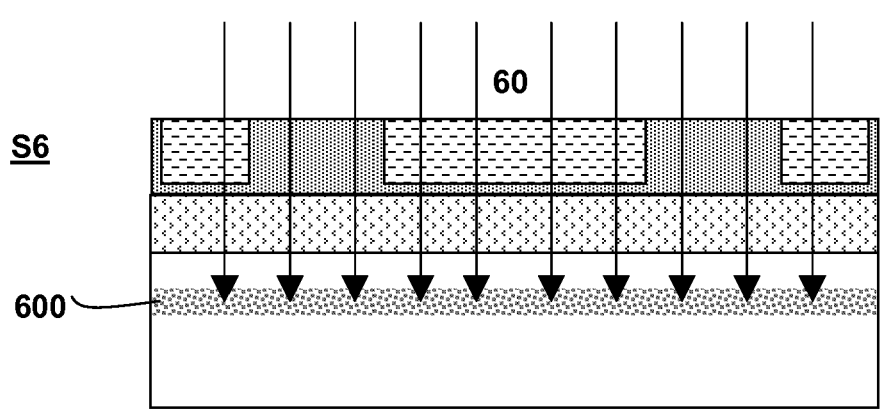

In process S4, a thin oxide film 301, having a thickness ranging from approximately 5 nm to approximately 20 nm, is formed covering each SOI island 401, as shown in FIG. 5. In process S5, shown in FIG. 6, a silicon oxide fill 302 is deposited to fill any gaps 40 (FIG. 5) between SOI islands 401. Thin oxide film 301 is high quality oxide film that protects a shallow trench isolation (STI) surface and requires a long time to deposit or form. Silicon oxide fill 302 is a much thicker film (approximately 30 nm to approximately 200 nm) but may be low quality to provide good throughput for manufacturing. Following deposition of silicon oxide fill 302, polishing using, for example, but not limited to chemical mechanical polishing (CMP), is applied to form a polished surface 50. FIG. 7 shows process S6, a hydrogen implantation process 60, to form a hydrogen implanted layer 600, alternatively known as a hydrogen damaged layer, within substrate 100.

Figure 8:
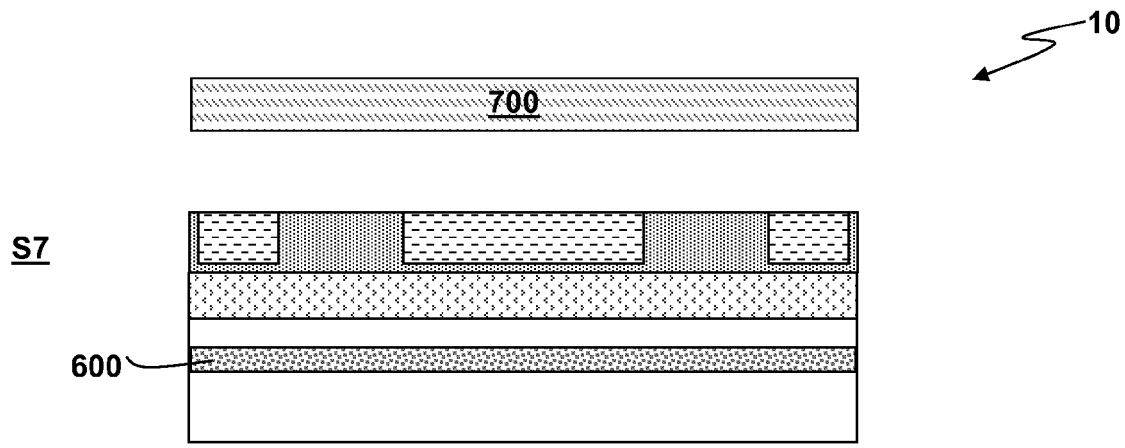

In FIG. 8, a silicon layer 700, for example, but not limited to a handle wafer, is bonded to polished surface 50 according to process S7. The bonding includes currently known or later developed techniques, for example, but not limited to a conventional SMART CUT™ technique. According to process S8 in FIG. 9, substrate 100 is cleaved at hydrogen implanted layer 600 forming residual substrate 101 and cleaved substrate portion 102, which is removed. As shown in FIG. 10, semiconductor structure 10 is flipped such that silicon layer 700 is located at the bottom of semiconductor structure 10 as a new substrate. Residual substrate 101 and silicon nitride layer 200 are removed through an etching process in process S9 exposing a surface of silicon oxide fill 302 and a surface of SOI islands 401. The exposed surface of silicon oxide fill 302 form shallow trench isolation (STI) regions 800 and the exposed surface of SOI islands 401 form active regions 810. STI isolation regions 800 may have a width ranging from, for example, approximately 20 nm to approximately 300 nm. The STI regions 800 and active regions 810 share a coplanar surface 90 in resulting semiconductor structure 10 (FIG. 10).

FIGS. 11-12 illustrate an alternative embodiment at processes S5a according to scheme B that produce an alternative semiconductor structure 20. According to scheme B, the processes S1-S4 are followed by process S5a (i.e., process S5 is replaced by process S5a), which is followed by processes S6-S9 (FIGS. 7-9). As shown in FIG. 11, in addition to filling any gaps 40 (FIG. 5) between SOI islands 401 (FIG. 6) as in process S5, process S5a also includes having silicon oxide fill 303 deposited to cover SOI islands 401 such that SOI islands 401 embedded within a thickness of the silicon oxide fill 303. The thickness of silicon oxide fill 303 may include a range from approximately half (½) the width of STI regions 800 to approximately 2 times the width of STI regions 800, preferably, from approximately 30 nm to approximately 200 nm. Polishing follows after deposition of silicon oxide fill 303 using, for example, but not limited to chemical mechanical polishing (CMP) to form a polished surface 50a. From process S5a, scheme B continues with processes S6-S9 (FIGS. 7-10). As shown in FIG. 12, resulting semiconductor structure 20 includes SOI islands 401 embedded in silicon oxide fill 303. Silicon oxide fill 303 forms shallow trench isolation (STI) regions 800 and SOI islands 401 form active regions 810. STI regions 800 and active regions 810 share a coplanar surface 90a. STI isolation regions 800 may have a width ranging from, for example, approximately 20 nm to approximately 300 nm.

FIGS. 13-15 illustrate alternative embodiments at processes S4b-S5b according to scheme C that produces an alternative resulting semiconductor structure 30. According to scheme C, processes S1-S3 are followed by process S4b and then process S5b (i.e., process S4 is replaced by process S4b and process S5 is replaced by process S5b). Processes S6-S9 (FIGS. 7-10) follow after completion of process S5b. As shown in FIG. 13, process S4b, in addition to forming a thin oxide film 301 (FIG. 5) to cover each SOI island 401 (FIG. 5) as in process S4, includes forming a thin silicon nitride layer 201 over the thin oxide film 301, resulting in oxide-and-nitride covered SOI islands 402. In FIG. 14, process S5b, which is essentially the same as process S5a, includes deposition of silicon oxide fill 303 over thin silicon nitride layer 201 to embed oxide-and-nitride covered SOI islands 402 under a thickness of silicon oxide fill 303. Silicon oxide fill 303 includes a thickness above thin silicon nitride layer 201. For good refilling, the thickness of the silicon oxide fill 303 may range from approximately half (½) the width of STI region 800 to approximately 2 times the width of STI regions 800 such that the total thickness may range form approximately 30 nm to approximately 200 nm. Further processing according to processes S6-S9 (FIGS. 7-10) in scheme C leads to semiconductor structure 30, as shown in FIG. 15, where nitride layer 201 on silicon oxide fill 303 form STI regions 802 and SOI islands 402 form active regions 810. STI regions 802 and active regions 810 share a coplanar surface 90b. Coplanar surface 90b also includes exposed silicon oxide 301.

The foregoing description of various aspects of the disclosure has been presented for purposes of illustration and description. It is not intended to be exhaustive or to limit the scope of the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method for forming coplanar active regions and isolation regions in a semiconductor structure, the method comprising:
   depositing a semiconductor-on-insulator (SOI) layer on a substrate;
   etching to remove portions of the SOI layer over the substrate, the etching including forming openings between remaining portions of the SOI layer;
   forming shallow trench isolation (STI) regions in the openings between the remaining portions of the SOI layer;
   implanting the substrate with hydrogen to form a hydrogen implanted region;
   bonding a silicon layer to a surface of the STI region and the SOI layer;
   cleaving the substrate at the hydrogen implanted region formed within the substrate; and
   etching all of the substrate not cleaved after the cleaving to expose at least one active region and at least one isolation region, wherein the at least one active region and the at least one isolation region are coplanar.

2. The method according to claim 1, further comprising forming a nitride layer on the substrate prior to the depositing of the SOI layer.

3. The method according to claim 2, further comprising forming a thin oxide layer on the nitride layer prior to depositing of the SOI layer.

4. The method according to claim 3, wherein the etching to remove portions of the SOI layer over the substrate includes stopping the etching at the thin oxide layer; and wherein the forming of STI regions includes filling the openings with an oxide fill.

5. The method according to claim 4, further comprising forming a thin oxide film over the remaining portions of the SOI layer prior to the filling.

6. The method according to claim 5, further comprising forming a thin nitride layer over the thin oxide film prior to the filling.

7. The method according to claim 6, wherein the oxide fill covers the thin nitride layer over the thin oxide film.

8. The method according to claim 5, further comprising removing the thin oxide layer to expose at least one active region and at least one isolation region using chemical mechanical polishing following the etching of the all of the substrate not cleaved.

9. The method according to claim 5, wherein the oxide fill covers the thin oxide film over each remaining portion of the SOI layer island.

10. The method according to claim 5, wherein the oxide fill has a thickness ranging from approximately 3 nm to approximately 20 nm.

11. A method for forming coplanar active regions and isolation regions in a semiconductor structure, the method comprising:

forming a silicon nitride layer on a substrate;

forming a thin oxide layer over the silicon nitride layer;

depositing a semiconductor-on-insulator (SOI) layer on the thin oxide layer;

removing portions of the SOI layer over the thin oxide layer, the removing including forming openings between remaining portions of the SOI layer;

forming shallow trench isolation (STI) regions in the openings between the remaining portions of the SOI layer;

polishing to form a substantially uniform surface between the STI regions and the remaining portions of the SOI layer;

implanting the substrate with hydrogen to form a hydrogen implanted region;

bonding a silicon layer to the substantially uniform surface of the STI region and the SOI layer;

cleaving the substrate at the hydrogen implanted region formed within the substrate; and etching all of the substrate not cleaved after the cleaving to expose at least one active region and at least one isolation region, wherein the at least one active region and the at least one isolation region are coplanar.

* * * * *